US008610592B2

(12) United States Patent
Schoen

(10) Patent No.: US 8,610,592 B2
(45) Date of Patent: *Dec. 17, 2013

(54) PROXIMITY SWITCH

(75) Inventor: Dierk Schoen, Egelsbach (DE)

(73) Assignee: Pepperl + Fuchs GmbH, Mannheim (DE)

( * ) Notice: Subject to any disclaimer, the term of this patent is extended or adjusted under 35 U.S.C. 154(b) by 516 days.

This patent is subject to a terminal disclaimer.

(21) Appl. No.: 12/864,981

(22) PCT Filed: Jan. 30, 2009

(86) PCT No.: PCT/EP2009/000614
§ 371 (c)(1),
(2), (4) Date: Sep. 9, 2010

(87) PCT Pub. No.: WO2009/095252
PCT Pub. Date: Aug. 6, 2009

(65) Prior Publication Data
US 2011/0001550 A1    Jan. 6, 2011

(30) Foreign Application Priority Data

Jan. 30, 2008  (DE) .................. 10 2008 006 746
Feb. 13, 2008  (EP) ..................... 08002680

(51) Int. Cl.
*G08B 21/00* (2006.01)

(52) U.S. Cl.
USPC ............... 340/686.6; 340/815.4; 340/815.45; 340/815.55; 340/815.73; 439/490; 362/249.05; 362/249.12; 362/276

(58) Field of Classification Search
USPC ............ 340/686.1, 691.1, 815.4, 815.45, 340/815.55–815.57, 815.65, 815.69, 340/815.73–815.75; 439/76.1, 445, 447, 439/490, 910, 913; 362/231, 249.02, 362/249.05, 249.12, 276, 802, 154–156, 362/202, 362–375, 253
See application file for complete search history.

(56) References Cited

U.S. PATENT DOCUMENTS

| 5,244,409 | A | | 9/1993 | Guss, III et al. | |
|---|---|---|---|---|---|
| 5,246,285 | A | * | 9/1993 | Redburn et al. | ............ 312/223.5 |
| 2007/0161268 | A1 | * | 7/2007 | Muschketat | ................ 439/76.1 |

FOREIGN PATENT DOCUMENTS

| DE | 10343529 A1 | 4/2005 |
|---|---|---|
| EP | 1 806 564 A2 | 7/2007 |
| WO | 2005022963 A1 | 3/2005 |

OTHER PUBLICATIONS

PCT, "International Preliminary Report on Patentability", International Application No. PCT/EP2009/000614, International Filing Date Jan. 30, 2009, 4 pages.
PCT, "International Search Report", International Application No. PCT/EP2009/000614, 6 pages.

* cited by examiner

*Primary Examiner* — Brian Zimmerman
*Assistant Examiner* — Laura Nguyen
(74) *Attorney, Agent, or Firm* — Hoffman Warnick LLC

(57) ABSTRACT

The invention relates to a proximity switch for the detection of objects, comprising a sleeve-type housing, comprising a transducer unit disposed at a measuring end of said sleeve-type housing, the transducer unit comprising a transducer receptacle and a transducer element disposed therein for detecting a physical measurand, comprising a connecting piece disposed at a connecting end of said sleeve-type housing, comprising an electronic assembly disposed on a printed circuit board accommodated in said sleeve-type housing and having a control and evaluation unit adapted to control said transducer element, to evaluate signals measured by said transducer element and to emit switching signals to an environment, wherein variously colored light-emitting diodes are disposed on said printed circuit board at the measuring end and at the connecting end for indicating operational and/or switching states, wherein said transducer receptacle exhibits a transparent region disposed around a housing axis and/or a transparent region at an end face. The proximity switch is characterized in that said connecting piece has a peripheral transparent region, that said transparent regions at said measuring end and at said connecting end are optically homogeneous, that said transparent regions are each capable of being monochromatically illuminated by said light-emitting diodes and that said control and evaluation unit is adapted to control the respective variously colored light-emitting diodes for indicating different operational and/or switching states.

14 Claims, 3 Drawing Sheets

PROXIMITY SWITCH

FIELD OF THE INVENTION

The present invention relates to a proximity switch for detecting objects.

RELATED ART

Such proximity switches are known in a number of versions, e.g. from DE 103 43 529 A1. In particular, they can be inductive, capacitive, or ultrasonic proximity switches.

A generic proximity switch comprises the following components: a sleeve-type housing, a transducer unit that is arranged at the measuring end of the housing, which transducer unit has a transducer receptacle and a transducer element disposed therein for detecting a physical measurand and a connecting element arranged at a connecting end of the housing. The proximity switch also comprises an electronic assembly which is accommodated in the housing and is located on a printed circuit board and which comprises a control and evaluation unit, said control and evaluation unit being adapted to control the transducer element, for evaluating signals measured by the transducer element and for emitting switching signals to an environment. Variously colored light emitting diodes for indicating operational and/or switching states are disposed on the printed circuit board at the measuring end and at the connecting end. The transducer receptacle comprises a transparent region disposed about a housing axis and/or a transparent region on an end face.

The optical indication enables a user to recognize from an exterior position switching and/or operational states of the sensor, such as "object recognized", "no object recognized" or "configurating the sensor".

For optically indicating a larger number of various states and for achieving a good all-round visibility of the optical indication, i.e. visibility from preferably every spatial direction, DE 103 43 529 A1 proposes a device having a transparent housing part that is subdivided into different segments by means of suitable partitions, which segments accommodate appropriate light-emitting means. As a result, a very clearly visible and thus ergonomic indication for a user can be achieved, especially for sensors having a plurality of switching states and operational states.

However, experience has shown that for many applications comparatively few switching states have to be indicated to the environment and that the aforementioned partitions are not necessary for, and may even be obstructive to, such applications.

SUMMARY OF THE INVENTION

It can be considered to be an object of the present invention to provide a proximity switch for detecting objects which is preferably simply constructed and which generates signals that are particularly clearly visible in as large a spatial region as possible.

The proximity switch of the aforementioned type is developed, according to the invention, in that the connecting element comprises a peripheral transparent region, in that the transparent regions at the measuring end and at the connecting element are optically homogenous, in that the transparent regions can each be illuminated in a single color by means of the light emitting diodes, and in that the control and evaluation unit is adapted for controlling variously colored light emitting diodes for indicating the different operational states and/or switching states.

A central idea of the invention may be considered to reside in the fact that a transparent region, more particularly a peripheral transparent region, is provided both at the measuring end and at the connecting end of the housing. This mainly achieves good visibility of the indication in two directions. Hence the proximity switch of the invention is particularly suitable for applications in which an indication is to be accomplished on both sides of a wall, for example a housing wall.

A further central idea of the invention can be considered to reside in the fact that each of the transparent regions, i.e. the regions through which the optical indication to an environment is accomplished, extends around the periphery, i.e. is substantially rotationally symmetrical. Hereby it is ensured that the optical indication is, e.g. on one side of the housing wall, visible circumferentially to the sensor.

Finally the present invention comprises, as a further fundamental idea, the feature that the transparent regions at the measuring end and at the connecting end are optically homogeneous, in order to ensure that the optical indication itself is effectively carried out. This means, in other words, that, unlike the prior art, the respective transparent regions do not comprise any partitions.

The proximity switch of the invention produces the optical indication such that a certain switching state or operational state is assigned to a certain color and that the colors are coded accordingly. When a larger number of switching states or operational states is to be coded, it may be advantageous to adapt the control and evaluation unit so as to control variously colored light emitting diodes for indicating different switching states and/or operational states in a defined chronological sequence. For example, the light emitting diodes can flash with different frequencies.

In the present description the expression "optically homogenous" is substantially taken to mean an optical characteristic of the material used that results in the transparent region imparting to the user and the viewer the impression of homogenous illumination.

For the purposes of the present description the term "transparent" is substantially taken to mean that the regions described as transparent are pervious to light, i.e. to electromagnetic radiation in the visible range. However, it is also taken to mean such elements which strongly scatter the passing light. This can be a preferred variant when it is desired to reduce the number of light-emitting means, as, for example, when illumination of the transparent regions is to be effected using only one light emitting diode at each of the measuring end and the connecting end.

The transparent regions can preferably be formed in one piece made of an optically homogenous material, in order to achieve the desired homogenous characteristics of the transparent regions.

In a particularly advantageous variant, the transparent regions are injection molded using a transparent plastics material.

Furthermore, a particular advantage of the proximity switch of the invention may be seen to reside in the fact that through the design of the transparent regions according to the invention the effort in connection with light emitting means used can be reduced.

In order to increase the scattering power of the transparent regions, the optically homogenous material can be supplemented by appropriate scattering particles, more particularly particles showing a substantially constant distribution density.

The light emitting diodes are advantageously disposed on both sides of the printed circuit board, in order to achieve illumination of the transparent regions that is as even as possible.

In preferred embodiments of the proximity switch of the invention, the transducer receptacle and/or the connecting element are at least partially made of a transparent plastics material. In this case, the light of the light emitting means can be directed outwardly through the transducer receptacle and/or the connecting element. The light emitting diodes are preferably disposed in the region of the transducer receptacle, on the one hand, and in the region of the connecting element, on the other hand, so that the transducer receptacle and the connecting element assume the function of an optical waveguide. Preferably the transducer receptacle is produced by cover-molding a shielding cup. This results in improved properties in high voltage tests, simplification in power input, and improved EMC characteristics.

The illumination of the transparent regions and thus overall optical indication can be improved when at least one light coupling element is provided for each light emitting diode at the transducer receptacle and/or at the connecting element. Such light coupling elements are produced by appropriate shaping of the transducer receptacle and of the connecting element so as to assist the light of the light emitting diodes to enter the transparent regions.

In a further preferred embodiment, the transducer receptacle is closed at the measuring end. This can be advantageous when the proximity switch is to be used in an environment having a high intake of contamination or humidity.

In addition it may be preferable, in such applications, for the transducer receptacle extend through the sleeve-type housing from the measuring end up to the connecting end and for the transducer receptacle to be in sealing engagement with the connecting element at the connecting end, as there is then only one sealing connection.

The connecting element may be in the form of a cable exit or a plug-type exit.

Principally, the electronic assembly can be spread over a plurality of printed circuit boards. However, it is particularly preferred for just one printed circuit board to be present which extends along the axis of the sleeve-type housing.

Basically, the sleeve-type housing can be made of plastics material. However, metal sleeve-type housings are particularly preferred, and it is convenient when suitable mounting means are available on an external surface of the sleeve-type housing for mounting the proximity switch to a wall. In particular, through-mounting is preferred in the sense that the measuring end of the proximity switch is located on one side of the wall and the connecting end is located on the other side of the wall. A screw-thread formed on the external surface of the sleeve-type housing would be particularly suitable mounting means so that the proximity switch could be screwed into the wall or could first be inserted and then secured with nuts on both sides. In general, the external surface of the sleeve-type housing can be smooth, for example for use in the field of hygiene, and a clamping device can be used as mounting means.

With regard to indicating the switching states and/or the operational states it is further preferred that those light emitting diodes at the measuring end and those light emitting diodes at the connecting end that have the same color be connected in parallel.

To improve the illumination of the transparent regions, it is advantageous when a plurality of light emitting diodes is available for each color, for example for red, green and yellow, at both the measuring end and the connecting end.

Basically, the transducer element can be any physical sensor element that is suitable for the construction of a proximity switch. In particular, inductive, capacitive, and/or ultrasonic proximity switches are suitable.

In a particularly preferred embodiment, the transducer element is an induction coil of an inductive proximity switch wound on a coil former. The printed circuit board can comprise a tongue, more particularly a symmetrical tongue formed thereon, which tongue carries light emitting diodes and protrudes into the coil former or extends through the coil former. These light emitting diodes can illuminate the transparent region near the end face of the transducer receptacle.

Basically, the transducer receptacle itself can have any shape adapted to the respective application. In preferred embodiments, the transducer receptacle is substantially cylindrical, and a detecting region of the transducer element extends in the axial direction. This means that the proximity switch will switch when an object to be detected approaches axially. In applications with little space, embodiments in which a detecting region is transverse to, more particularly perpendicular to, the housing axis can be preferred.

In such cases a side of the transducer receptacle which is remote from the detecting region of the transducer element and which may also be referred to as an angled or angular transducer receptacle, can be utilized for indicating switching states and/or operational states of the proximity switch. In a preferred embodiment, at least one more transparent region for indicating switching states and/or operational states is provided at the transducer receptacle on a side remote from the detection region of the transducer element.

The control and evaluation unit can preferably be in the form of a microcontroller or a programmable logic chip.

BRIEF DESCRIPTION OF THE DRAWINGS

Further advantages and features of the present invention are described in detail below with reference to the diagrammatic figures, in which.

DETAILED DESCRIPTION OF THE INVENTION

Figure 1:
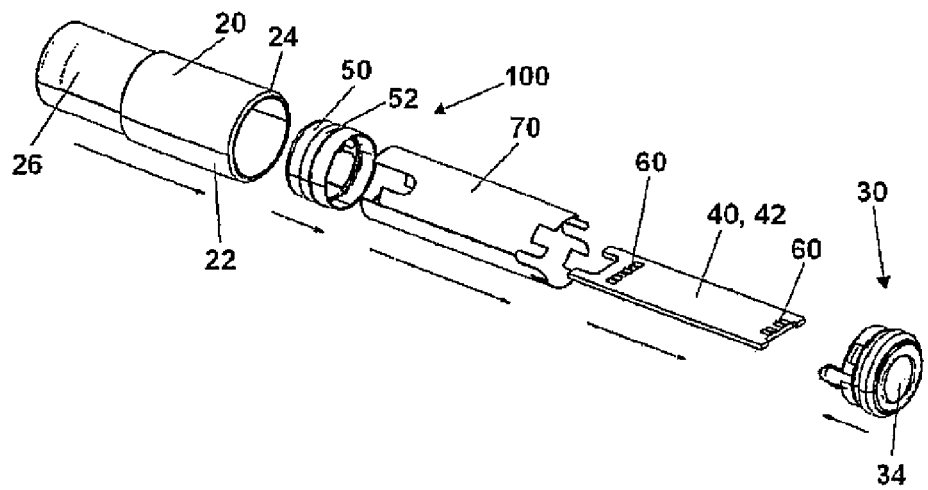
FIG. 1 is an exploded view of a first embodiment of a proximity switch of the invention.
Figure 2:
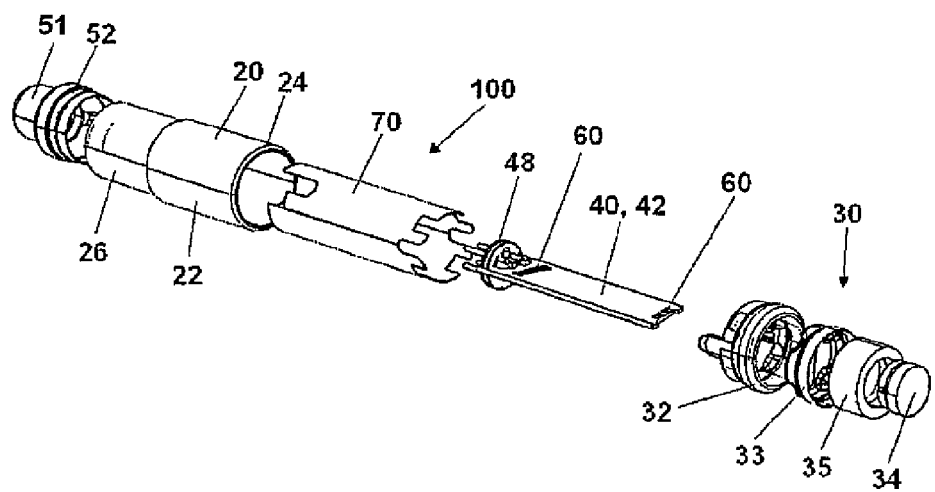
FIG. 2 is an exploded view of a second embodiment of a proximity switch of the invention.

Two embodiments of a proximity switch 100 of the invention are shown in FIGS. 1 and 2. Both figures show cylindrical ultrasonic sensors which differ in design in the region of a connecting end 26. In the example shown in FIG. 1 a cable exit (not shown in detail in the figure) is provided. The example shown in FIG. 2 comprises a plug-type exit comprising a plug-in module 48.

Equivalent components are provided with the same reference signs in all figures.

The proximity switches 100 shown in FIGS. 1 and 2 each comprise, as the basic component parts, a sleeve-type housing 20, a transducer element 30, and a printed circuit board 40, on which an electronic assembly 42, which is not shown in detail, is disposed.

Furthermore, a metallic shielding sleeve 70, into which the printed circuit board 40 is inserted in the installed state, is provided for shielding the electronic assembly 42. The printed circuit board 40 has substantially the shape of an elongated rectangle and extends along a housing axis of the proximity switch 100 in the installed state. The transducer element 30 is housed in the region of a measuring end 24 in the housing 20 in the installed state. As can also be seen from the exploded views shown in FIGS. 1 and 2, a connecting element 50 for the variant having a cable exit shown in FIG. 1 and a connecting element 51 for the variant having a plug-type exit shown in FIG. 2 are arranged at a connecting end 26 of the sleeve-type housing 20 opposing the measuring end 24. The connecting element 50 and the connecting element 51 also serve to ensure stable positioning of the printed circuit board 40 in the region of the connecting end 26 of the sleeve-type housing 20.

Figure 3:
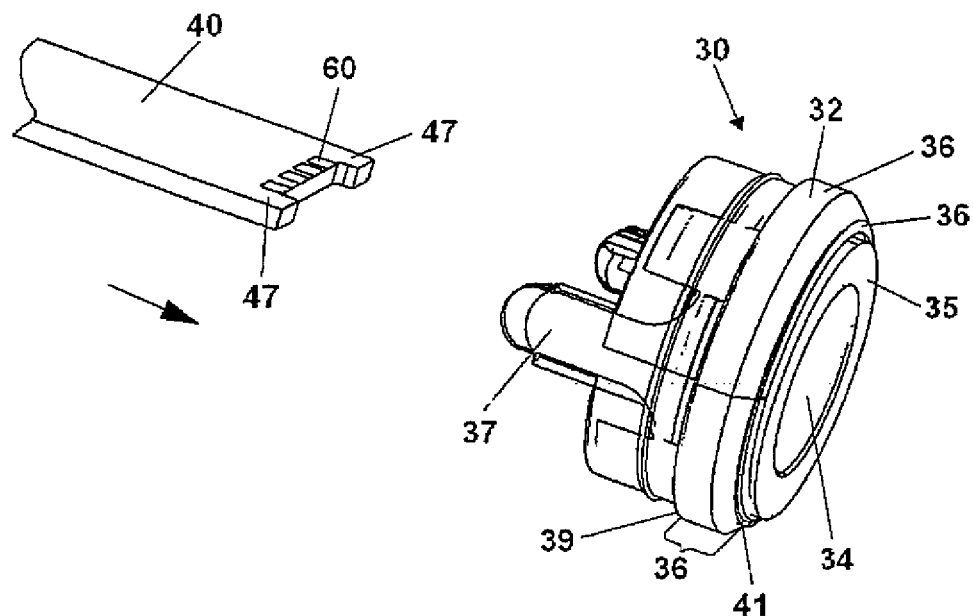
FIG. 3 is a detailed view of the embodiment shown in FIG. 1.

The plug-type exit of the embodiment shown in FIG. 3 is provided by the plug-in module 48 which is housed and held in the connecting element 21.

A screw thread 22 is formed on the external surface of the sleeve-type housing 20 for the purpose of mounting the proximity switch 100.

The transducer unit 30 comprises, as illustrated for example in the exploded view shown in FIG. 2, a transducer receptacle 32, a transducer element 34, a shielding cup 33, and foamed filling 35. The transducer element 34 of the example shown is an ultrasonic transducer element which is embedded in the foamed filling 35 for the purpose of achieving acoustic decoupling from the environment. In principle the transducer element can, however, be any sensor element suitable for detecting approaching objects. In particular, an inductive proximity switch can be a measuring coil, and a capacitive proximity switch can be a suitable capacitive sensor element.

The shielding cup 33 serves to shield the unit from electromagnetic interferences from the environment and thus to ensure substantially faultless transmission of measurement signals from the transducer element 34 to the electronic assembly 42 and thus to the control and evaluation unit which is not shown in detail in the figures.

The transducer receptacle 32 can, in particular, be a molded part of plastics material which is injection-molded around the shielding cup 33. The transducer receptacle 32 fulfills mechanical and optical functions, as is explained in detail with reference to FIG. 3. First of all, it may be seen that the printed circuit board 40 is accommodated and held with the aid of tongues 47 in guiding attachments 37 formed on the transducer receptacle 32. According to an essential feature of the present invention, the transducer receptacle 32 comprises a transparent region 36 around its periphery and extending from an edge 39 to a margin 41 of the foamed filling 35. This transparent region 36, which may also be referred to as an illuminating surface or illuminating region, is, according to the invention, optically homogeneous. This means that this region 36 will appear as substantially emitting light homogeneously when viewed from outside when it is illuminated from inside by light emitting diodes 60 disposed on the printed circuit board 40 and shown diagrammatically in FIG. 3. In particular, the light emitted by the region 36 is monochrome when illuminated from inside by one light emitting diode or by a plurality of light emitting diodes 60 of the same color.

In the same way a peripheral transparent region 52 is provided and formed around the connecting element 50 in FIG. 1 and around the connecting element 51 in FIG. 2, said connecting elements being optically homogeneous in the same manner. Thus the connecting end 26 of the proximity switch 100 of the invention will also present the user with a substantially homogeneously light emitting illuminating surface. The transparent regions provided according to the invention can also be referred to and regarded as illuminating regions or illuminating surfaces.

The proximity switch of the invention is particularly suitable for applications which require optical indication of switching states and/or operational states on both sides of a wall. This is described in detail below with reference to FIGS. 4 and 5.

Figure 4:
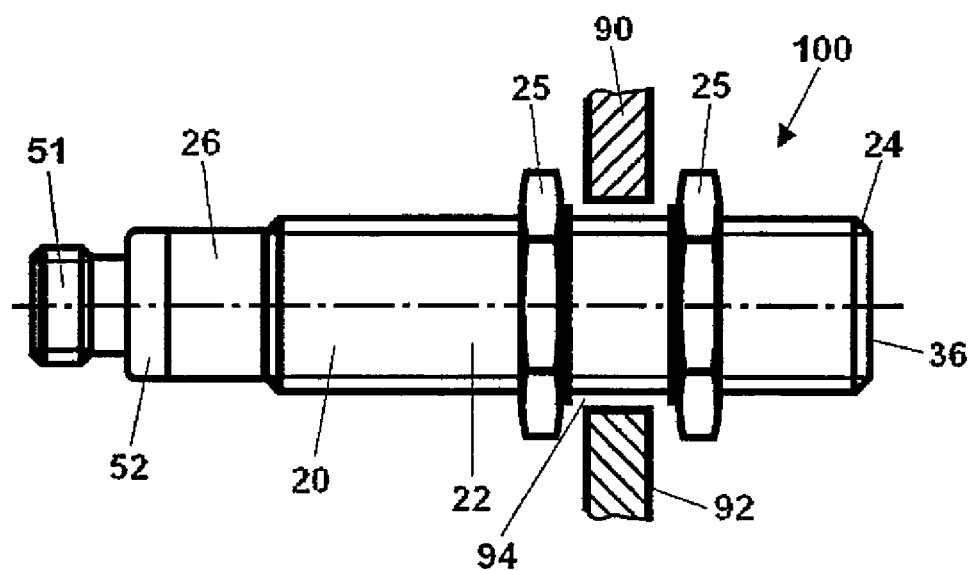
FIG. 4 shows a third embodiment of a proximity switch of the invention.

FIG. 4 shows an exemplary embodiment of a proximity switch 100 of the invention which is mounted extending through an opening 94 of a wall 90. The sleeve-type housing 20 is pushed through the opening 94 and nuts 25 are screwed onto the thread 22 of the sleeve-type housing 20 on both sides of the wall 90 to fix the sleeve-housing housing in the opening 94. The measuring end 24 with the peripheral transparent region 36 provided according to the invention is located on a visible side 92 of the wall 90. Accordingly, the connecting end 26 of the sleeve-type housing 20 and the connecting element 51 with the peripheral transparent region 52 provided according to the invention are located on that side of the wall 90 which is remote from the visible side 92. FIG. 4 shows that the proximity switch 100 of the invention provides particularly effective optical indication of switching states and/or operational states on both sides of a wall 90.

Figure 5:
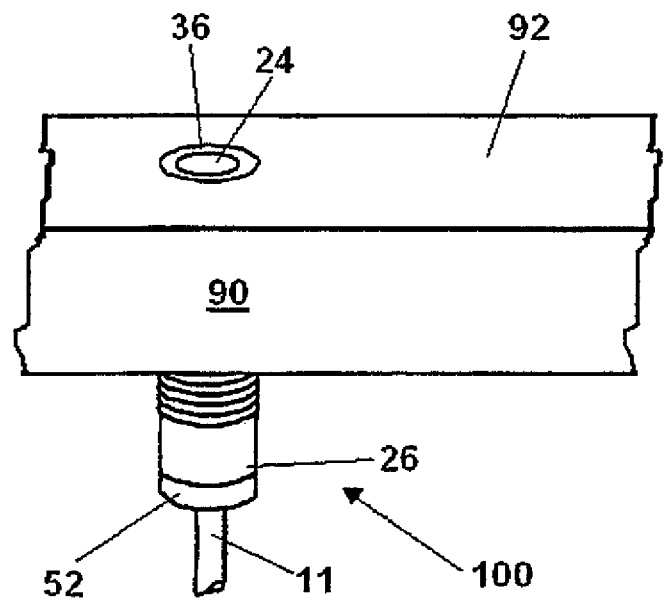
FIG. 5 shows a fourth embodiment of a proximity switch of the invention.

FIG. 5 shows a further variant of a proximity switch of the invention, which, unlike the example shown in FIG. 4, is mounted in a wall 90 such that the measuring end 24 ends flush with the visible side 92. In addition, the peripheral transparent region 36 provided according to the invention ends substantially flush with the visible side 92. According to the invention there is also provided a peripheral transparent region 52 in the region of the connecting end and a connecting cable 11.

The proximity switch 100 of the invention can alternatively be screwed directly into the opening of a wall with the aid of the screw-thread 22 formed on the external surface of the sleeve-type housing 20. Furthermore, for example for applications in the field of hygiene, the external surface of the sleeve-type housing 20 can be substantially smooth, and appropriate clamping means for fixing the sleeve-type housing 20 in an opening of a wall can be provided.

Figure 6:
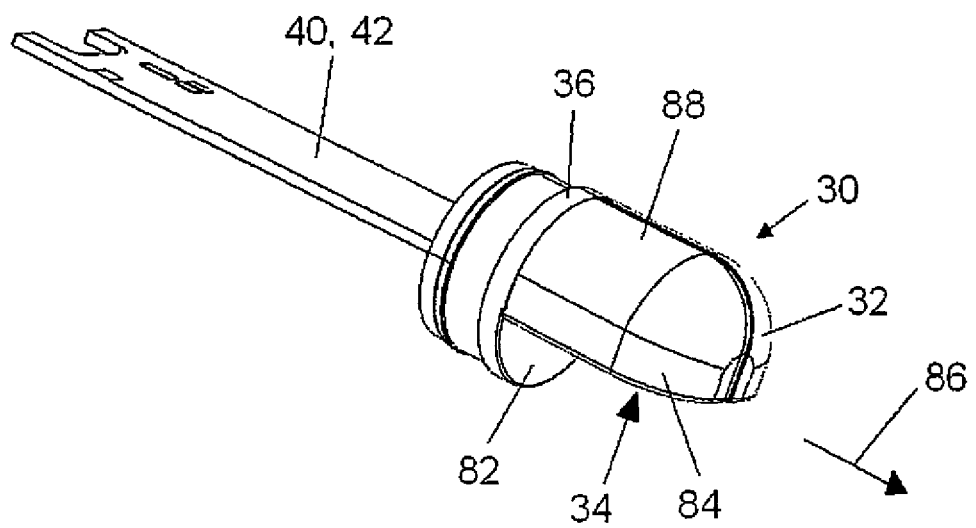
FIG. 6 is a partial view of a fifth embodiment of a proximity switch of the invention.

A fifth exemplary embodiment of a proximity switch of the invention is shown as a partial view in FIG. 6. FIG. 6 shows a printed circuit board 40 on which a transducer unit 30 is mounted. The essential difference between this embodiment and the aforementioned variants is that a transducer element 34 is inserted into a transducer receptacle 32 such that the detecting region of said transducer element 34 extends transversely to, more particularly perpendicularly to, an axis 86 of the transducer receptacle 32. In particular, the transducer element 34 can be an ultrasonic transducer element.

As in the variants described above, the example shown in FIG. 6 is provided with a peripheral transparent region 36 that can also be referred to as a peripheral illuminating edge or peripheral illuminating ring.

The orientation of the transducer element 34 differing from that shown in the exemplary embodiments hitherto described provides further possibilities for the indication of switching states and/or operational states by the proximity switch. For example, further transparent regions that can be illuminated by means of internal light emitting diodes for the purpose of displaying and indicating switching states and/or operational states to the environment can be provided on the transducer receptacle 32 in the regions 82, 84, and 88. These transparent regions preferably have the same characteristics as the transparent regions provided in accordance with the invention described above, i.e. they are made of an optically homogeneous material and therefore create for a viewer an impression of illumination of substantially even intensity.

In principle, it is also possible to form the complete transducer receptacle 32 or the complete front part, i.e. the part of the transducer receptacle 32 situated on the right-hand side of the peripheral transparent region 36 in FIG. 6, as a transparent light emitting region.

Light conducting regions and light conducting elements can be formed inside the transducer receptacle 32 depending on where in detail the transparent regions are formed on or in the transducer receptacle 32.

The present invention provides a new type of proximity switch showing a very simple design, on the one hand, and with which, on the other hand, particularly effective visible indication of operational states and/or switching states can be achieved.

The invention claimed is:

1. Proximity switch for detecting objects, comprising:
a sleeve-type housing;
a transducer unit disposed at a measuring end of the sleeve-type housing, the transducer unit comprising a transducer receptacle and a transducer element disposed therein for detecting a physical measurand;
a connecting piece disposed at a connecting end of the sleeve-type housing;
an electronic assembly disposed on a printed circuit board accommodated in the sleeve-type housing and having a control and evaluation unit adapted to control the transducer element, to evaluate signals measured by the transducer element, and to emit switching signals to an environment;
the connecting piece having a peripheral transparent region which is formed optically homogeneously and is capable of being monochromatically illuminated by light-emitting diodes;
wherein
variously colored light-emitting diodes are disposed on the printed circuit board at the measuring end and at the connecting end for indicating at least one of operational states and switching states;
the transducer receptacle exhibits at least one of a transparent region disposed around a housing axis and a transparent region at an end face, which transparent region is formed optically homogeneously and is capable of being monochromatically illuminated by the light-emitting diodes; and
the control and evaluation unit is adapted to control the respective variously colored light-emitting diodes for indicating at least one of different operational states and switching states.

2. Proximity switch as defined in claim 1,
wherein the transparent regions are in the form of a single piece made of an optically homogeneous material.
3. Proximity switch as defined in claim 1,
wherein the transparent regions are injection-molded using a transparent plastics material.
4. Proximity switch as defined in claim 1,
wherein the light-emitting diodes are disposed on both sides of the printed circuit board.
5. Proximity switch as defined in claim 1,
wherein at least one of the transducer receptacle and the connecting piece are at least partially made of a transparent plastics material.
6. Proximity switch as defined in claim 1,
wherein light-coupling elements are molded onto at least one of the transducer receptacle and the connecting piece for each light-emitting diode.
7. Proximity switch as defined in claim 1,
wherein the transducer receptacle is closed at the measuring end.
8. Proximity switch as defined in claim 1,
wherein the transducer receptacle extends from the measuring end to the connecting end through the sleeve-like housing and is in sealed engagement at the connecting end with the connecting piece.
9. Proximity switch as defined in claim 1,
wherein the light-emitting diodes at the measuring end and the light-emitting diodes at the connecting end exhibiting the same color, are connected in parallel.
10. Proximity switch as defined in claim 1,
wherein both at the measuring end and at the connecting end a plurality of light-emitting diodes is present for each color.
11. Proximity switch as defined in claim 1,
wherein the transducer element includes an induction coil wound on a coil former of an inductive proximity switch;
wherein on the printed circuit board there is formed a tongue on which light-emitting diodes are disposed and which protrudes into the coil former; and
wherein the end-face transparent region of the transducer receptacle is capable of being illuminated by the light-emitting diodes disposed on the tongue of the printed circuit board.
12. Proximity switch as defined in claim 1,
wherein a detection zone of the transducer element extends transversely to a housing axis.
13. Proximity switch as defined in claim 1,
wherein a detection zone of the transducer element extends perpendicularly to a housing axis.
14. Proximity switch as defined in claim 12,
wherein at least one transparent region is provided on a side of the transducer receptacle remote from the detection region of the transducer element for indicating at least one of switching states and operational states.

* * * * *